(12) United States Patent
Park et al.

(10) Patent No.: US 7,800,186 B2
(45) Date of Patent: Sep. 21, 2010

(54) SEMICONDUCTOR DEVICE AND METHOD OF FABRICATING METAL GATE OF THE SAME

(75) Inventors: Sung-ho Park, Yongin-si (KR); Jin-seo Noh, Seoul (KR); Joong-S. Jeon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/073,628

(22) Filed: Mar. 7, 2008

(65) Prior Publication Data

US 2009/0057783 A1 Mar. 5, 2009

(30) Foreign Application Priority Data

Sep. 5, 2007 (KR) .................. 10-2007-0089958

(51) Int. Cl.
*H01L 29/78* (2006.01)

(52) U.S. Cl. .............. 257/407; 257/288; 257/369; 257/E23.157

(58) Field of Classification Search .......... 257/369, 257/407, 288, E23.157
See application file for complete search history.

(56) References Cited

U.S. PATENT DOCUMENTS

2008/0157212 A1* 7/2008 Lavoie et al. ............ 257/369
2009/0068828 A1* 3/2009 Chambers et al. ........ 438/592

* cited by examiner

*Primary Examiner*—Davienne Monbleau
*Assistant Examiner*—Eduardo A Rodela
(74) *Attorney, Agent, or Firm*—Harness, Dickey & Pierce, P.L.C.

(57) ABSTRACT

Provided is a semiconductor device and a method of fabricating a metal gate in the semiconductor device. The semiconductor device includes a metal gate formed on a gate insulating film, the metal gate is formed of a mixture of a metal nitride and a metal carbide, and a work function of the metal gate is determined according to ratios of the metal nitride with respect to the metal carbide.

11 Claims, 2 Drawing Sheets

SEMICONDUCTOR DEVICE AND METHOD OF FABRICATING METAL GATE OF THE SAME

CROSS-REFERENCE TO RELATED PATENT APPLICATION

This application claims the benefit of Korean Patent Application No. 10-2007-0089958, filed on Sep. 5, 2007, in the Korean Intellectual Property Office, the disclosure of which is incorporated herein in its entirety by reference.

BACKGROUND OF THE INVENTION

1. Field of the Invention

The present invention relates to a semiconductor device and a method of fabricating a metal gate of the semiconductor device, and more particularly, to a complementary metal oxide semiconductor (CMOS) device having metal gates with different work functions and a method of fabricating the metal gate of the CMOS device.

2. Description of the Related Art

A complementary metal oxide semiconductor (CMOS) device includes a p-channel metal oxide semiconductor (PMOS) transistor and an n-channel metal oxide semiconductor (NMOS) transistor that are complementarily operated. Thus, the CMOS device can increase overall efficiency and operation speed, and accordingly can be used as a high performance semiconductor device since the CMOS device has the same characteristics as a bipolar transistor.

In the prior art, a gate of the CMOS device is fabricated, for example, by forming a polysilicon, which is doped in same type as the channels, on a gate insulating film formed of a silicon oxide ($SiO_2$) film. For example, a gate of the PMOS transistor is formed using a polysilicon doped with a P-type dopant, and a gate of the NMOS transistor is formed using a polysilicon doped with an N-type dopant. However, as the thickness of thin films in a semiconductor device is gradually reduced due to increased integration of the semiconductor device, the thickness of the conventional $SiO_2$ thin film that is used as a gate insulating film is reduced. As a result, a leakage current is increased due to tunneling effect, and thus, power consumption is increased above a standard value. In order to address this problem, high-k oxide films have drawn attentions since the high-k oxide films can be used to realize a thick gate insulating film that electrically has an identical equivalent oxide film thickness and physically does not generate tunneling. As a result, $SiO_2$ is replaced by high dielectric materials such as $HfO_2$ or $Al_2O_3$.

However, when the high dielectric material is used for the gate insulating film, dopants in the doped polysilicon formed on the gate insulating layer are diffused into the gate insulating film. In order to address this problem, recently, studies to use a metal gate instead of the doped polysilicon have been conducted. When a metal is used for the gate, in order to obtain a desired threshold voltage of the NMOS transistor and the PMOS transistor, it is necessary to use two metals having work functions different from each other with respect to the NMOS transistor and the PMOS transistor as the gate electrode. However, a method of fabricating this structure is complicated and difficult.

SUMMARY OF THE INVENTION

To address the above and/or other problems, the present invention provides a method of fabricating metal gates having different work functions in a semiconductor device, in particular, in a CMOS device, the method not complicating the manufacturing process of the semiconductor device.

The present invention also provides a semiconductor device, in particular, a CMOS device that includes metal gates having different work functions.

According to an aspect of the present invention, there is provided a semiconductor device having a metal gate formed on a gate insulating film, wherein the metal gate is formed of a mixture of a metal nitride and a metal carbide, and a work function of the metal gate is determined according to ratios of the metal nitride with respect to the metal carbide.

The metal nitride may be TiN and the metal carbide may be TiC.

The work function of the metal gate may increase with the increase in the TiN ratio in the metal gate, and the work function of the metal gate may decrease with the increase of TiC ratio in the metal gate.

The metal gate may be formed using $Ti[N(CH_3)_2]_4$ (TD-MAT) as a precursor in a chemical vapor deposition (CVD) process.

The gate insulating film may be formed of a silicon oxide film or a high dielectric oxide film.

The semiconductor device may be a CMOS device that comprises a PMOS transistor and an NMOS transistor, which respectively have metal gates with work functions different from each other.

The ratio of metal nitride in the metal gate of the PMOS transistor may be higher than that of metal nitride in the metal gate of the NMOS transistor.

The ratio of metal nitride in the metal gate of the PMOS transistor may be 85 to 95 at %, and the ratio of metal nitride in the metal gate of the NMOS transistor may be 5 to 15 at %.

According to an aspect of the present invention, there is provided a method of fabricating a metal gate of a semiconductor device, the method comprising: forming a gate insulating film on a semiconductor substrate; and forming a metal gate on the gate insulating film, wherein the metal gate comprises a metal nitride and a metal carbide, and a ratio between the metal nitride and the metal carbide in the metal gate is selected according to a work function of the metal gate.

The metal gate may be formed using $Ti[N(CH_3)_2]_4$ (TD-MAT) as a precursor in a chemical vapor deposition (CVD) process which is performed in a temperature range from 250 to 500° C. and in a power range from 50 to 200 W, and the TiC ratio may be increased the higher the deposition temperature or the stronger the intensity of the plasma in the above ranges.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A semiconductor device that includes metal gates having different work functions and a method of fabricating a metal gate of the semiconductor device according to the present invention will now be described more fully with reference to the accompanying drawings in which exemplary embodiments of the invention are shown.

Figure 1:
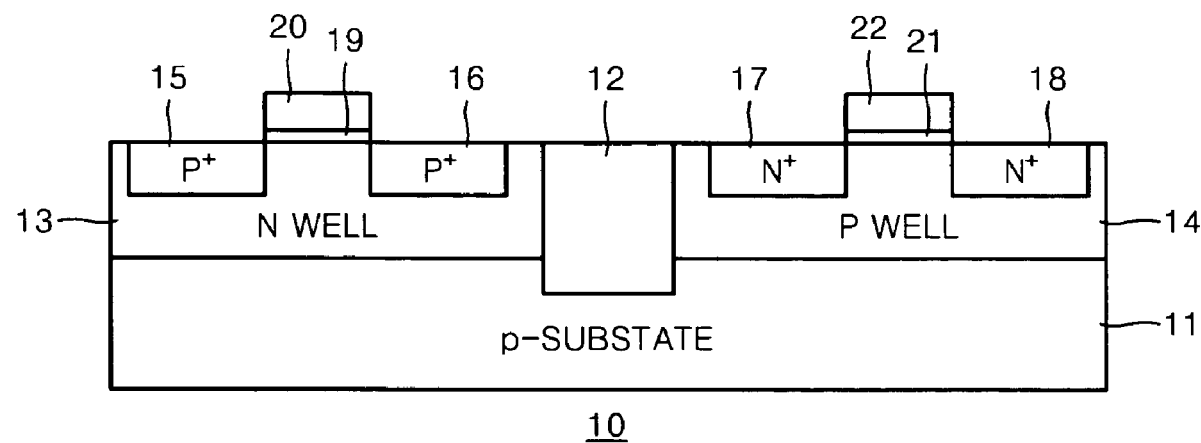
FIG. 1 is a schematic cross-sectional view of a conventional CMOS device that includes metal gates having different work functions.

FIG. 1 is a schematic cross-sectional view of a conventional CMOS device 10 that includes metal gates having different work functions. Referring to FIG. 1, the CMOS device 10 includes a p-channel metal oxide semiconductor (PMOS) transistor and an n-channel metal oxide semiconductor (NMOS) transistor respectively formed on a P-type substrate 11. In FIG. 1, the PMOS transistor is depicted on a left side and the NMOS transistor is depicted on a right side of the drawing. A field oxide film 12 is formed between the PMOS transistor and the NMOS transistor to electrically separate the PMOS transistor from the NMOS transistor.

The PMOS transistor includes an N-type well 13, a gate insulating film 19 formed on an upper center of the N-type well 13, a metal gate 20 formed on the gate insulating film 19, and a drain 15 and a source 16 respectively doped with a P+ dopant on the N-type well 13 on both sides of the gate insulating film 19. The NMOS transistor includes a P-type well 14, a gate insulating film 21 formed on an upper center of the P-type well 14, a metal gate 22 formed on the gate insulating film 21, and a drain 17 and a source 18 respectively doped with an N+ dopant on the P-type well 14 on both sides of the gate insulating film 21.

The gate insulating films 19 and 21 can be formed of a high dielectric material such as $HfO_2$ or $Al_2O_3$, or can be formed in a multiple layer structure that includes a high dielectric material layer and a $SiO_2$ layer.

As described above, the metal gate 20 of the PMOS transistor and the metal gate 22 of the NMOS transistor must be selected to have work functions different from each other. Generally, the metal gate 20 of the PMOS transistor may be selected to have a work function higher than that of the metal gate 22 of the NMOS transistor. It is easy to find pure metals having work functions required for the metal gate 20 of the PMOS transistor and the metal gate 22 of the NMOS transistor, respectively. However, if two pure metals different from each other are respectively used in the PMOS transistor and the NMOS transistor, the fabrication process of the CMOS device 10 is complicated. Also, there may be a diffusion problem of the pure metals since the pure metals generally have high reactivity with the gate insulating films 19 and 21.

Thus, in the present embodiment, the work function values in the metal gate 20 of the PMOS transistor and the metal gate 22 of the NMOS transistor are controlled by varying the mixing ratios of a metal compound material having a relatively large work function and a metal compound material having a relatively small work function. Also, in order to avoid the diffusion problem of the metal compound materials, a metal compound having high electrical conductivity and low reactivity with the gate insulating films 19 and 21 is selected as the metal material for the metal gates 20 and 22 instead of a pure metal. In particular, the metal compound used for the metal gate 20 of the PMOS transistor and the metal compound used for the metal gate 22 of the NMOS transistor can be formed from the same precursor, and it is appropriate that mixing ratio of the resultant metal compound materials can be varied according to conditions.

It has been found that two metal compounds that meet the above conditions are a metal nitride and a metal carbide. It has been known in the art that the metal nitride can be used as a barrier to prevent diffusion since the metal nitride has low reactivity with oxides such as $HfO_2$, $Al_2O_3$, or $SiO_2$ which are mainly used in the gate insulating films 19 and 21. Also, the metal carbide generally has a work function smaller than that of the metal nitride. For example, pure TiN has a work function of approximately 5.1 eV, and pure TiC has a work function of approximately 3.88 to 4.03 eV.

Furthermore, a mixture of the metal nitride and the metal carbide can be formed using the same precursor in a chemical vapour deposition (CVD) process, and the mixing ratio can be varied according to deposition temperature and plasma condition. For example, a mixture of TiC and TiN can be formed using $Ti[N(CH_3)_2]_4$ (TDMAT) as a precursor in a CVD process. In this case, the deposition temperature can be controlled in a temperature range from 250 to 500° C., and the plasma condition can be controlled in a power range from 50 to 200 W. At this point, in the above ranges, the amount of TiC increases with the increase of the deposition temperature and plasma intensity. However, in the above ranges, the amount of TiN increases with the decrease of the deposition temperature and plasma intensity.

Figure 2:
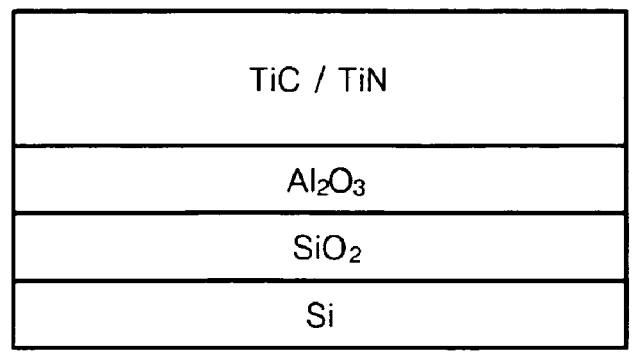
FIG. 2 is a schematic cross-sectional view of a structure of a metal gate according to an embodiment of the present invention.

In the present embodiment, in order to confirm the variations of work function and resistivity of the CMOS device 10 according to the variation of the mixing ratio of TiN and TiC, as depicted in FIG. 2, a $SiO_2$ layer and an $Al_2O_3$ layer as gate insulating layers are formed on a semiconductor substrate formed of silicon, and a mixture layer of TiC and TiN as a metal gate is formed on the $Al_2O_3$ layer. The $SiO_2$ layer has a thickness of approximately 100 Å and the $Al_2O_3$ layer has a thickness of approximately 50 Å. As described above, a plurality of metal gate specimens having different ratios of TiN and TiC are formed in the structure depicted in FIG. 2 using TDMAT as a precursor by varying deposition temperature and plasma condition in a CVD process, and the work functions and resistivity of each of the specimens were measured.

Figure 3:
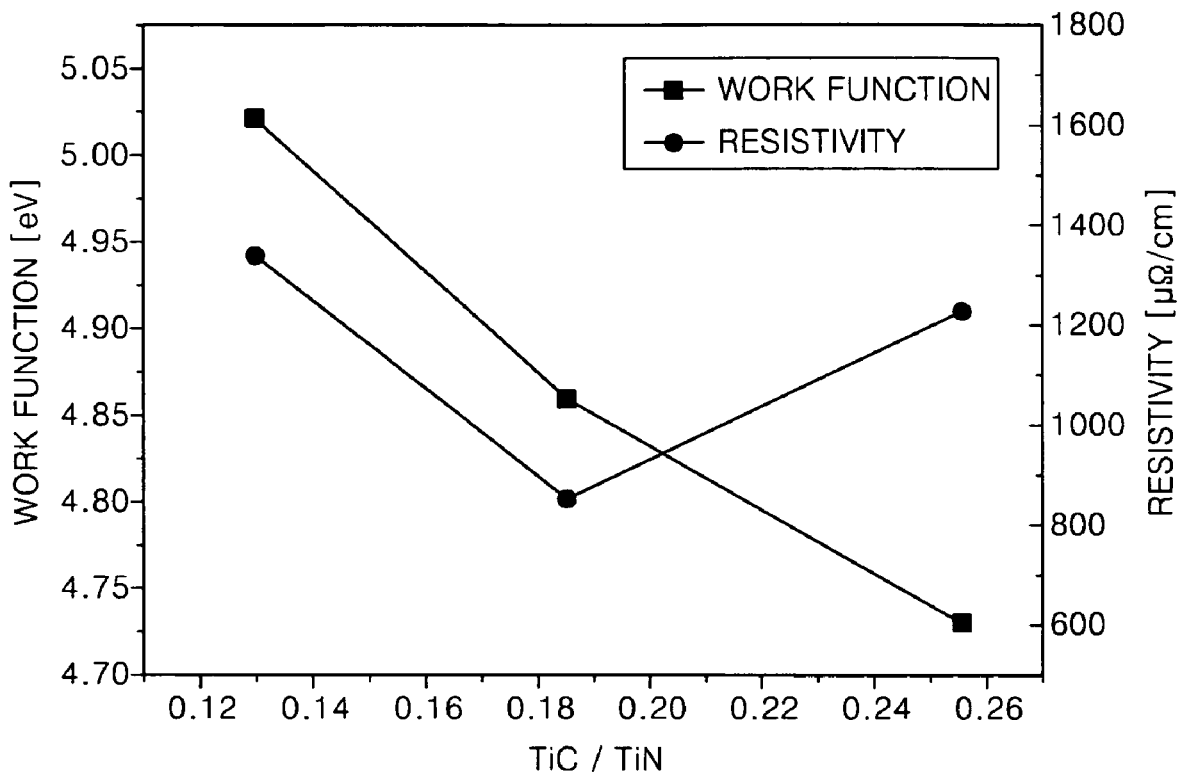
FIG. 3 is a graph showing the variations of work function and resistivity of a gate according to ratio changes between a metal carbide and a metal nitride in a metal gate according to an embodiment of the present invention.

FIG. 3 shows the measurement results of the work functions and the resistivity. In FIG. 3, symbol -■- indicates the work function of the metal gate, and symbol -●- indicates the resistivity of the metal gate. As shown in FIG. 3, while the ratio (or the ratio (at %) of C atoms with respect to N atoms) of TiC with respect to TiN changes from 12% to 26%, the work function of the metal gate is gradually reduced from approximately 5.02 eV to approximately 4.72 eV. Although not shown in the graph, if the amount of TiC is continuously increased, the work function is continuously reduced, and thus, it is possible to reduce the work function to approximately 3.88 to 4.03 eV, which is the work function of pure TiC. The resistivity of the metal gate is constantly reduced until the ratio of TiC to TiN is approximately 18.5%, and constantly increased with the increase in the TiC ratio.

Thus, the work functions of the metal gate 20 of the PMOS transistor and the metal gate 22 of the NMOS transistor can be controlled to be optimum by using a mixture of a metal nitride and a metal carbide as the metal gate 20 and the metal gate 22 and appropriately controlling the ratios of the metal nitride and the metal carbide in a CVD process. For example, if TiN is used as the metal nitride and TiC is used as the metal carbide, a work function of approximately 4.9 eV can be obtained in the metal gate 20 of the PMOS transistor that has a relatively higher work function by controlling the ratio of TiN with respect to a total gate material to approximately 85 to 95% and the ratio of TiC with respect to the total gate material to approximately 5 to 15%. Also, a work function of approximately 4.2 eV can be obtained in the metal gate 22 of the NMOS transistor that has a relatively lower work function by controlling the ratio of TiN with respect to a total gate material to approximately 5 to 15% and the ratio of TiC with respect to the total gate material to approximately 85 to 95%.

According to the present invention, the metal gate 20 of the PMOS transistor and the metal gate 22 of the NMOS transistor can be formed using the same precursor in a CVD process, and thus, can be formed in a much simpler process than in a case where two kinds of metals are used for forming the metal gates. Also, desired values of work functions of each of the metal gates 20 and 22 can be obtained through a simple process by controlling only the deposition temperature and plasma condition in a CVD process.

According to the present invention, metal gates having desired work functions in a PMOS transistor and an NMOS transistor of a CMOS device can be formed using a simple method, and the work function of a semiconductor device can be readily controlled.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device, comprising:
a first metal gate on a first gate insulating film, and
a second metal gate on a second insulating film, wherein each of the metal gates includes a metal nitride and a metal carbide, and a work function of each of the metal gates is determined according to ratios of the metal nitride with respect to the metal carbide,
wherein the semiconductor device is a CMOS device having a PMOS transistor and an NMOS transistor, the first metal gate being a part of the PMOS transistor and the second metal gate being a part of the NMOS transistor, the metal gates having work functions different from each other,
wherein the ratio of metal nitride in the first metal gate of the PMOS transistor is higher than that of the second metal gate of the NMOS transistor, and
wherein the ratio of metal nitride in the first metal gate of the PMOS transistor is 85 to 95 at % and the ratio of metal nitride in the second metal gate of the NMOS transistor is 5 to 15 at %.

2. The semiconductor device of claim 1, wherein the metal nitride is TiN and the metal carbide is TiC.

3. The semiconductor device of claim 2, wherein the work function of each of the metal gates increases with an increase in the TiN ratio and decreases with an increase of the TiC ratio.

4. The semiconductor device of claim 2, wherein the metal gates are formed using $Ti[N(CH_3)_2]_4$ (TDMAT) as a precursor in a chemical vapor deposition (CVD) process.

5. The semiconductor device of claim 1, wherein the gate insulating films are formed of a silicon oxide film or a high dielectric oxide film.

6. A method of fabricating metal gates of a semiconductor device, comprising:
forming a first gate insulating film and a second gate insulating film on a semiconductor substrate; and
forming a first metal gate and a second metal gate on the first gate insulating film and the second gate insulating film, respectively,
wherein each of the metal gates includes a metal nitride and a metal carbide, and a ratio between the metal nitride and the metal carbide in the metal gates is selected according to a work function of each of the metal gates,
wherein the semiconductor device is a CMOS device having a PMOS transistor and an NMOS transistor, the first metal gate being a part of the PMOS transistor and the second metal gate being a part of the NMOS transistor the metal gates having work functions different from each other,
wherein the ratio of metal nitride in the first metal gate of the PMOS transistor is higher than that of the second metal gate of the NMOS transistor, and
wherein the ratio of metal nitride in the first metal gate of the PMOS transistor is 85 to 95 at %, and the ratio of metal nitride in the second metal gate of the NMOS transistor is 5 to 15 at %.

7. The method of claim 6, wherein the metal nitride is TiN and the metal carbide is TiC.

8. The method of claim 7, wherein the work function of each of the metal gates increases with an increase in the TiN ratio and decreases with an increase of the TiC ratio.

9. The method of claim 8, wherein the metal gates are formed using $Ti[N(CH_3)_2]_4$ (TDMAT) as a precursor in a chemical vapor deposition (CVD) process.

10. The method of claim 9, wherein the CVD process is performed in a temperature range from 250 to 500° C. and in a power range from 50 to 200 W, the TiC ratio increasing with increasing deposition temperature or plasma intensity.

11. The method of claim 6, wherein the gate insulating films are formed of a silicon oxide film or a high dielectric oxide film.

* * * * *